(12) United States Patent
Yukawa et al.

(10) Patent No.: US 8,587,082 B2
(45) Date of Patent: Nov. 19, 2013

(54) IMAGING DEVICE AND CAMERA MODULE

(75) Inventors: Hiroaki Yukawa, Kanagawa (JP);
Kensaku Maeda, Kanagawa (JP); Taizo Takachi, Kanagawa (JP); Yasushi Maruyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/398,258

(22) Filed: Feb. 16, 2012

(65) Prior Publication Data
US 2012/0256284 A1 Oct. 11, 2012

(30) Foreign Application Priority Data

Feb. 22, 2011 (JP) ................................ 2011-036337

(51) Int. Cl.
*H01L 27/146* (2006.01)

(52) U.S. Cl.
USPC ...................... 257/432; 257/443; 257/E27.13

(58) Field of Classification Search
USPC .................... 257/432, 443, E27.13
See application file for complete search history.

(56) References Cited

U.S. PATENT DOCUMENTS

| | | | |
|---|---|---|---|
| 2001/0005283 A1* | 6/2001 | Osawa et al. ................. | 359/497 |
| 2007/0054419 A1 | 3/2007 | Paik et al. | |
| 2008/0291303 A1* | 11/2008 | Onozawa et al. ............. | 348/294 |
| 2009/0303590 A1* | 12/2009 | Irie .............................. | 359/490 |
| 2010/0201834 A1* | 8/2010 | Maruyama et al. ......... | 348/222.1 |

FOREIGN PATENT DOCUMENTS

JP    2007-73958    3/2007

* cited by examiner

*Primary Examiner* — Steven J Fulk
(74) *Attorney, Agent, or Firm* — Oblon, Spivak, McClelland, Maier & Neustadt, L.L.P.

(57) ABSTRACT

An imaging device includes: an optical sensor including a light receiving unit capable of forming an object image; a seal material for protecting the light receiving unit of the optical sensor; an intermediate layer formed at least between the light receiving unit and an opposite surface of the seal material facing the light receiving unit; and a control film arranged between the intermediate layer and the opposite surface of the seal material, wherein, in the control film, a cutoff wavelength is shifted to a shortwave side in accordance with an incident angle of light which is obliquely incident on the film.

16 Claims, 11 Drawing Sheets

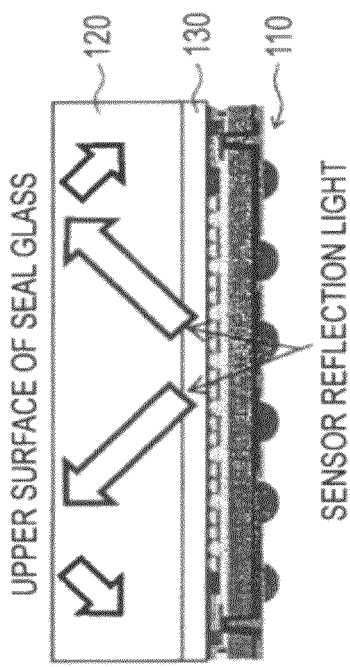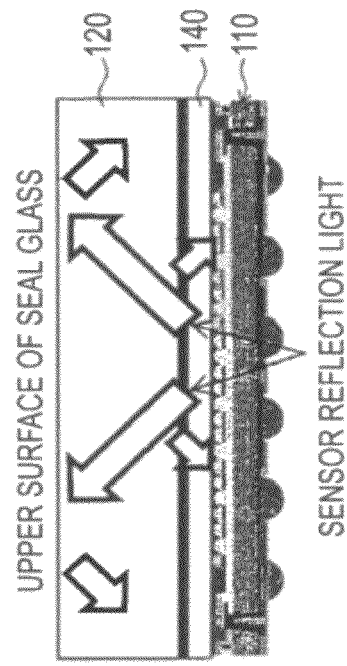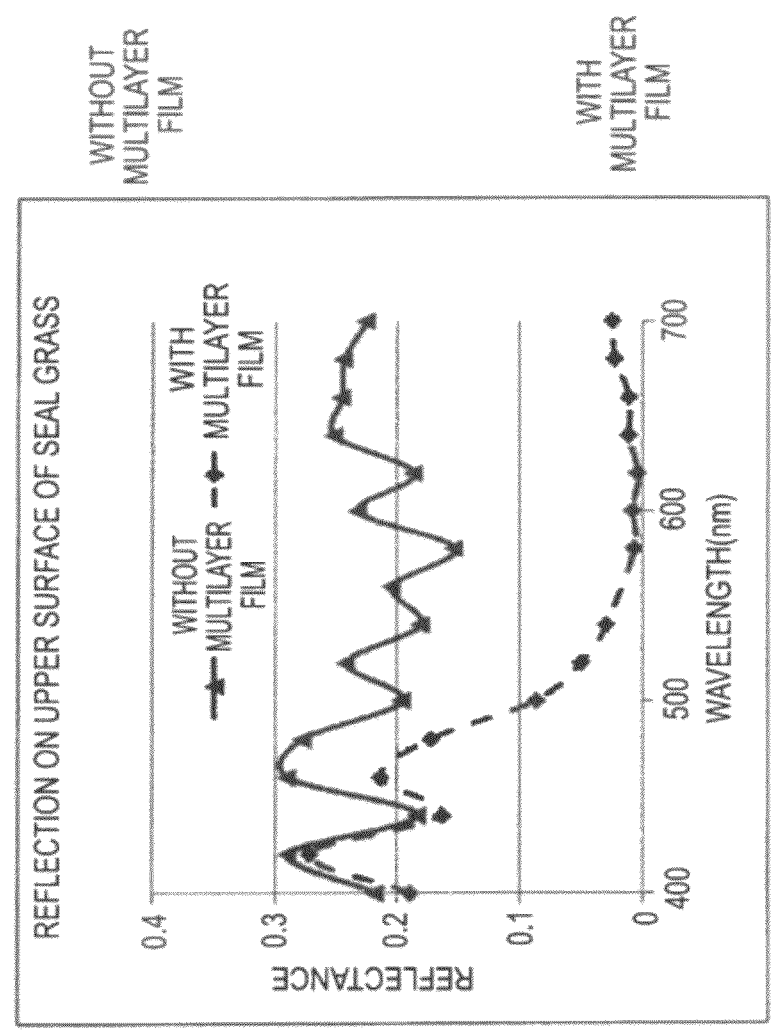

HEIGHT OF MULTILAYER FILM 50 μm: FLARE LIGHT IS INCONSPICUOUS AS FLARE LIGHT OVERLAPS SIGNAL LIGHT

HEIGHT OF MULTILAYER FILM 450 μm: FLARE LIGHT IS CONSPICUOUS AS FLARE LIGHT IS DIFFUSED AND SEPARATED FROM SIGNAL LIGHT

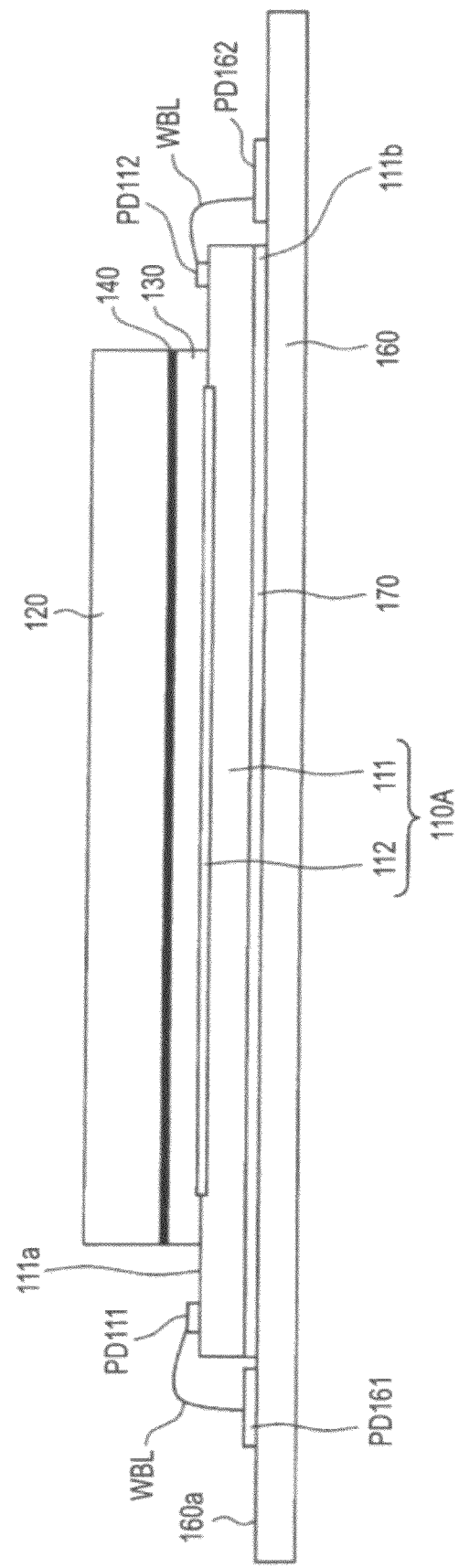

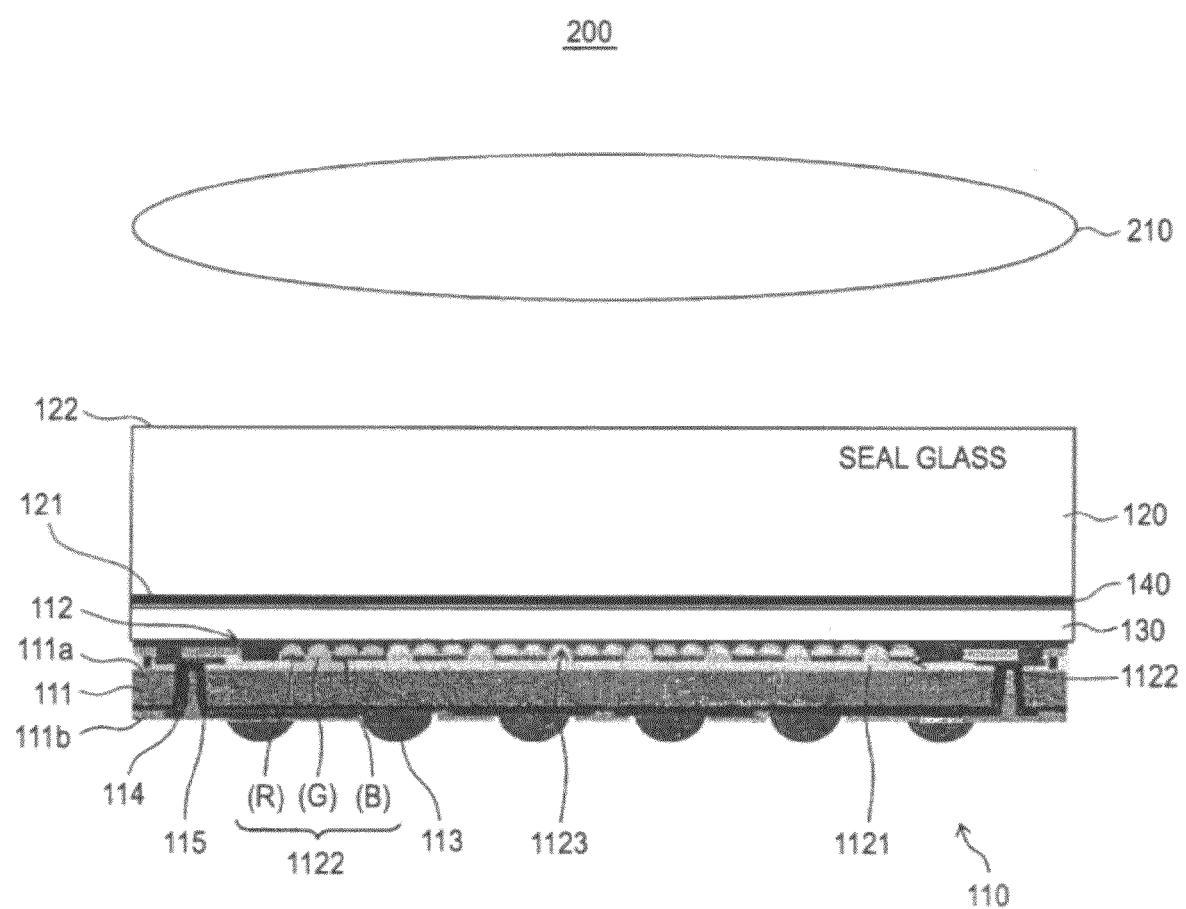

IMAGING DEVICE AND CAMERA MODULE

FIELD

The present disclosure relates to an imaging device and a camera module including an optical sensor such as a CCD image sensor or a CMOS image sensor (CIS) as a chip scale package.

BACKGROUND

As a simple packaging method of the optical sensor, a chip scale package (CSP) structure is proposed.

FIG. 1 is a view showing a basic structure of the CSP structure.

In the CSP structure 1, a seal glass (cover glass) 3 is arranged as a sealing member for protecting an upper portion of a light receiving unit 21 in a front surface of an optical sensor (sensor chip) 2.

In the CSP structure 1, the seal glass 3 is arranged through a resin 4 which is disposed at a peripheral portion excluding the light receiving unit 21 of the optical sensor 2. Therefore, a gap 5 is formed between the light receiving unit 21 of the optical sensor 2 and an opposite surface 31 of the seal glass 3 facing the light receiving surface 21 in the CSP structure.

In the CSP structure, wiring by wire bonding is eliminated by forming an electrode 6 by a through via hole (Through Silicon Via: TSV) piercing through the sensor chip from the front surface to a rear surface, therefore, the glass can be bonded in a wafer state in a clean room.

Accordingly, miniaturization, low costs and a dustless process can be expected as compared with a related-art COB (Chip On Board) type package.

However, the chip is formed thin in thickness as the through via hole (TSV) is formed in the CSP structure, therefore, there is a danger that chip warpage occurs due to thermal stress when a thermal process such as reflow is performed in the case where the gap 5 exists between the cover glass and the chip (optical chip) as described above.

As a method of solving the above, a CSP structure 1A in which the gap 5 is filled with the resin 4 as shown in FIG. 2 to eliminate the gap is proposed.

Hereinafter, the CSP structure not having the gap is also referred to as a cavity-less CSP structure.

When applying the cavity-less CSP structure not having the gap, the thermal stress generated in the gap of the CSP structure having the gap can be drastically reduced, thereby suppressing occurrence of warpage.

Also from an optical point of view, reflection occurring at a boundary of the gap (refractive index 1) can be suppressed by the resin having a refractive index of approximately 1.5 in the cavity-less CSP structure, therefore, increase of the light receiving amount in the optical sensor 2 can be expected.

The technique concerning the cavity-less structure is disclosed in, for example, JP-A-2007-73958 (Patent Document 1). In Patent Document 1, a manufacturing method for realizing the cavity-less CSP structure is mentioned.

SUMMARY

However, in the above cavity-less CSP structure, flare (false image) light which does not occur in a related-art package structure occurs.

The occurrence of flare light will be explained with reference to FIGS. 3A and 3B, and FIG. 4.

FIGS. 3A and 3B are views for explaining a total reflection mode on an upper surface of the seal glass according to existence of the gap in the SCP structure. FIG. 3A shows a state of the total reflection mode on the upper surface of the seal glass in the CSP structure having the gap, and FIG. 3B shows a state of the total reflection mode on the upper surface of the seal glass in the cavity-less CSP structure not having the gap.

FIG. 4 is a view showing flare light occurring in the cavity-less CSP structure not having the gap.

A factor of occurrence of the flare light is in the fact that diffraction light reflected on the optical sensor can be totally reflected on the upper surface of the seal glass as a refractive index under the seal glass is approximately the same as the seal glass 3 in the case of the cavity-less CSP structure as shown in FIG. 3B.

On the other hand, the total reflection does not occur on the upper surface of the seal glass in the SCP structure in which the gap exists between the optical sensor and the seal glass as shown in FIG. 3A.

The flare light is increased as a sensor pitch is reduced. Particularly in a small-sized optical sensor whose cell size is smaller than a 2 μm-pitch, there is a case where a flare in a so-called sparkler occurs, in which blurred light is diffused in all directions from a central light source as shown in FIG. 4.

It is therefore desirable to provide an imaging device and a camera module capable of suppressing occurrence of flare light and obtaining good quality images in which flare light is not inconspicuous even when a bright light source enters a visual field.

An embodiment of the present disclosure is directed to an imaging device including an optical sensor including a light receiving unit capable of forming an object image, a seal material for protecting the light receiving unit of the optical sensor, an intermediate layer formed at least between the light receiving unit and an opposite surface of the seal material facing the light receiving unit and a control film arranged between the intermediate layer and the opposite surface of the seal material, in which, in the control film, a cutoff wavelength is shifted to a shortwave side in accordance with an incident angle of light which is obliquely incident on the film.

Another embodiment of the present disclosure is directed to a camera module including an optical sensor including a light receiving unit capable of forming an object image, a seal material for protecting the light receiving unit of the optical sensor, an intermediate layer formed at least between the light receiving unit and an opposite surface of the seal material facing the light receiving unit, a control film arranged between the intermediate layer and the opposite surface of the seal material and a lens forming an object image on the light receiving unit of the optical sensor, in which, in the control film, a cutoff wavelength is shifted to a shortwave side in accordance with an incident angle of light which is obliquely incident on the film.

According to the embodiments of the present disclosure, it is possible to suppress occurrence of flare light and obtain good quality images in which flare light is inconspicuous even when a bright light source enters the visual field.

BRIEF DESCRIPTION OF THE DRAWINGS

FIGS. 8A to 8C are views showing results obtained by simulating reflectance on the upper surface of the cover glass in the case where the multilayer film is inserted between the resin and the lower surface of the cover glass and the case where the film is not inserted;

FIG. 12 is a view showing a second structure example of an imaging device according to the embodiment; and FIG. 13 is a view showing a structure example of a camera module according to the embodiment.

DETAILED DESCRIPTION

Hereinafter, embodiments of the present disclosure will be explained with reference to the drawings.

The explanation will be made in the following order.

1. A first structure example of an imaging device
2. Basic structure and functions of a control film (multilayer film)
3. Specific structure and functions of the control film (multilayer film)
4. Typical structure and functions of the control film (multilayer film)
5. Second structure example of the imaging device
6. Structure example of a camera module <1. A First Structure Example of an Imaging Device>

Figure 1:
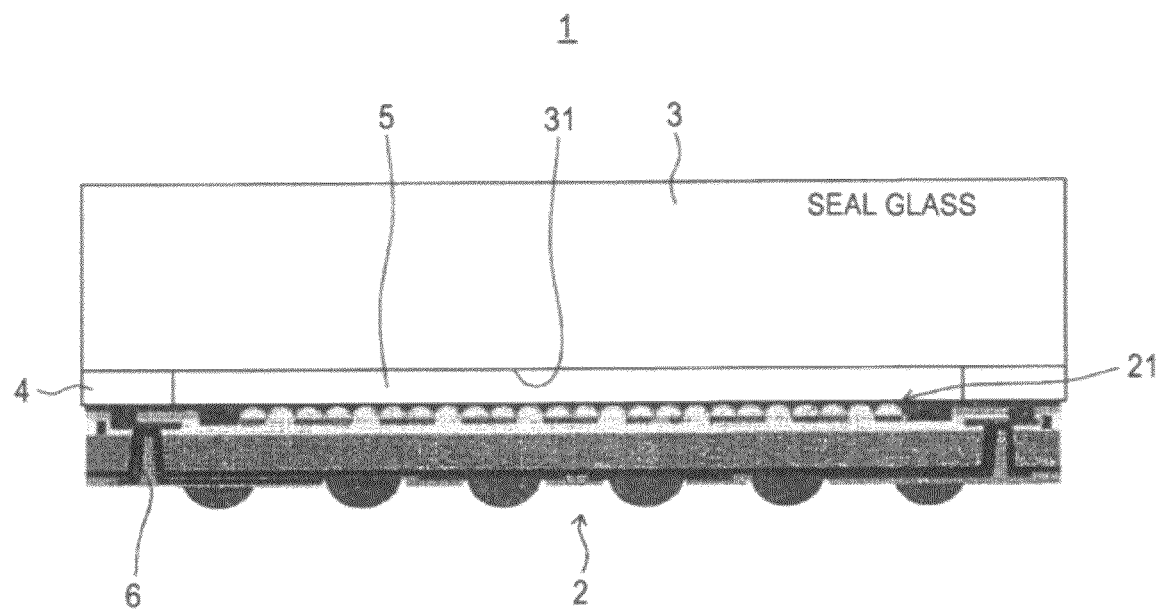
FIG. 1 is a view showing a basic structure of a CSP structure.
Figure 2:
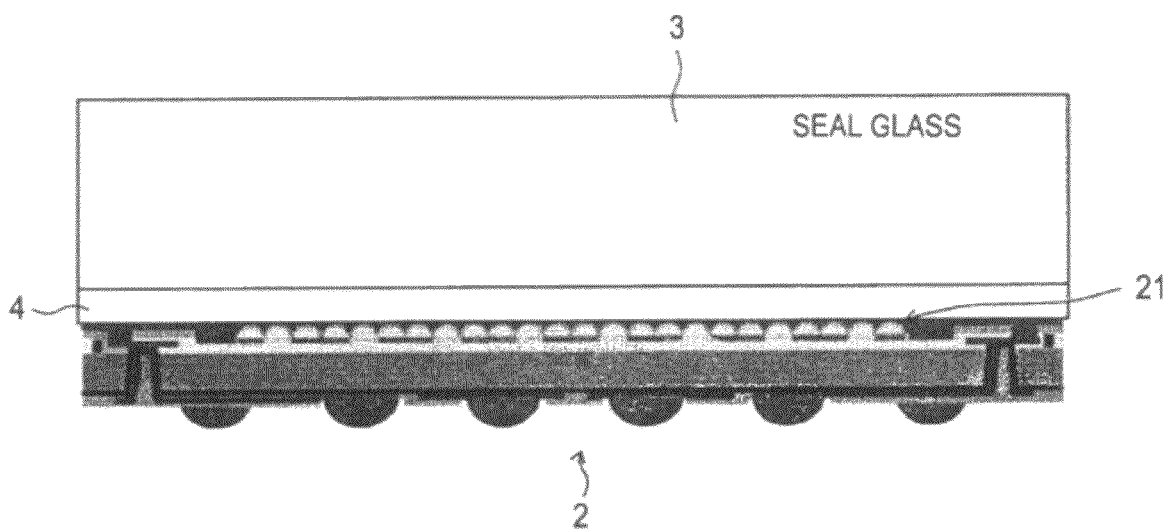
FIG. 2 is a view showing a structure of the CSP structure not having a gap.
Figure 3A:
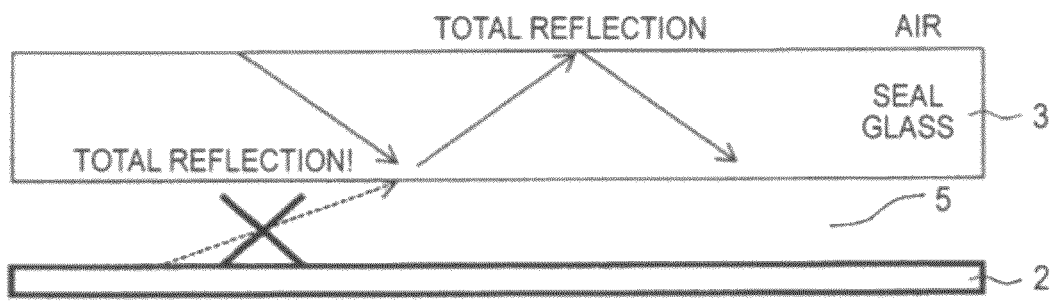
FIGS. 3A and 3B are views for explaining a total reflection mode on an upper surface of a seal glass according to existence of the gap in the SCP structure.
Figure 3B:
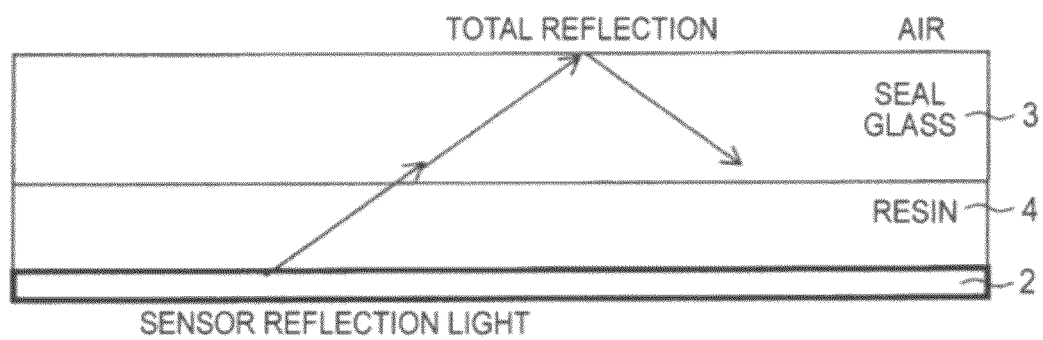
Figure 4:
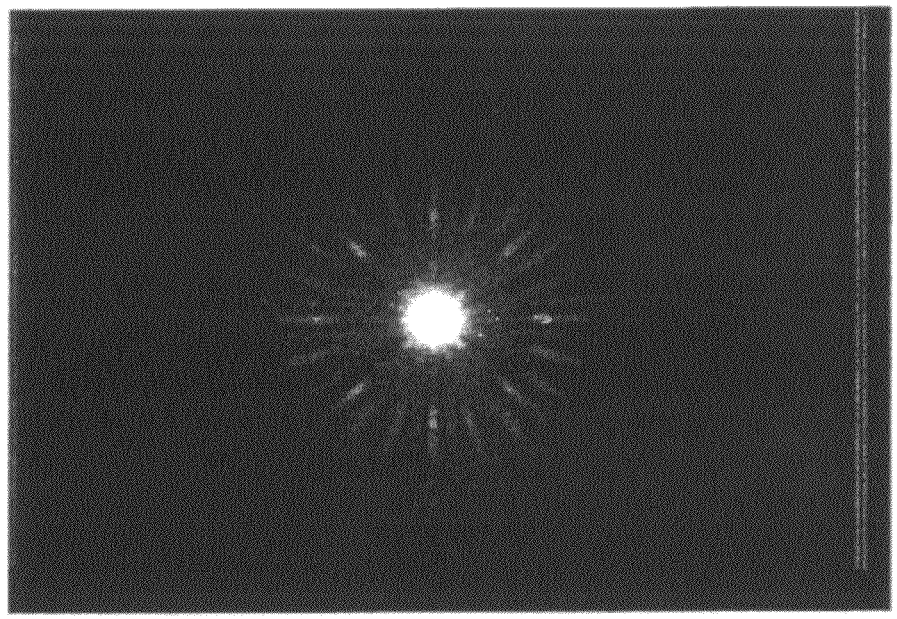
FIG. 4 is a view showing flare light occurring in a cavity-less CSP structure not having the gap.
Figure 5:
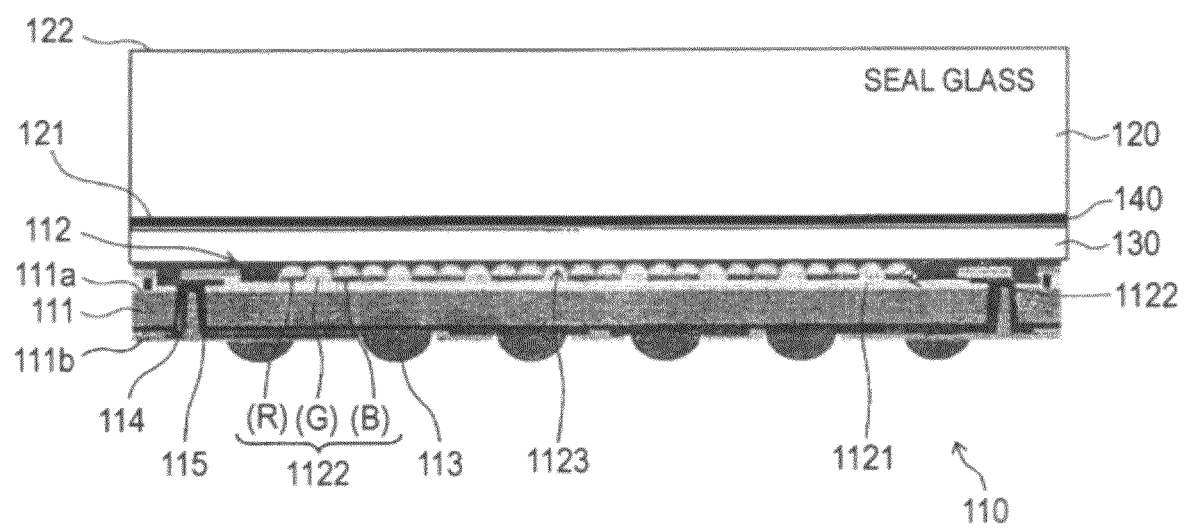
FIG. 5 is a view showing a first structure example of an imaging device according to the embodiment.

FIG. 5 is a view showing a first structure example of an imaging device according to the embodiment.

In the embodiment, a CMOS image sensor (CIS) is applied as an example of an optical sensor.

An imaging device 100 according to the embodiment basically has a CSP structure in which packaging is performed in the chip size of the optical sensor as well as a cavity-less CPS structure not having a gap in which an intermediate layer (resin in the embodiment) is formed between the optical sensor and a seal material protecting a front surface (upper surface) of the optical sensor.

In the present embodiment, the front surface indicates the incident side of image light of an object, on which a light receiving unit of the optical sensor in the imaging device is formed, and a rear surface indicates a side of a surface on which light is not incident and connection electrodes such as bumps, an interposer and so on are formed.

The imaging device 100 includes an optical sensor 110, a seal material 120, a resin layer 130 as an intermediate layer and a control film 140.

In the embodiment, the control film 140 is formed between the resin layer 130 as the intermediate layer and the seal material 120, which is made of a multilayer film in which a cutoff wavelength is shifted to a shortwave side in accordance with an incident angle of light which is obliquely incident on the film as described later.

The imaging device 100 according to the embodiment can suppress occurrence of flare light by the control film 140 and can obtain good quality images in which flare light is inconspicuous even when a bright light source enters a visual field.

The resin layer 130 as the intermediate layer and the seal material 120 are made of materials transparent with respect to light which transmits light, refractive indexes of which are higher than a refractive index of air, which are made of, for example, materials having a refractive index of approximately 1.5.

In the structure of FIG. 5, the example in which the seal material 120 is made of glass is shown, and the seal material 120 is also referred so as a seal glass or a cover glass.

In the optical sensor 110, a light receiving surface 112 is formed on a front surface 111a of a sensor substrate 111, and connection electrodes 113 such as bumps are formed on a rear surface 111b.

In the optical sensor 110, wiring by wire bonding is eliminated by forming an electrode 115 by a through via hole (Through Silicon Via: TSV) 114 piercing through the sensor chip from the front surface to the rear surface, therefore, the glass can be bonded in a wafer state in a clean room.

The light receiving unit 112 is formed on the front surface 111a of the sensor substrate 111, having a light receiving surface (pixel array unit) 1121 in which plural pixels (photo-detectors) are arranged in a matrix state.

In the light receiving unit 112, color filters 1122 are formed on the further front surface side of the pixel array unit 1121.

Figure 6:
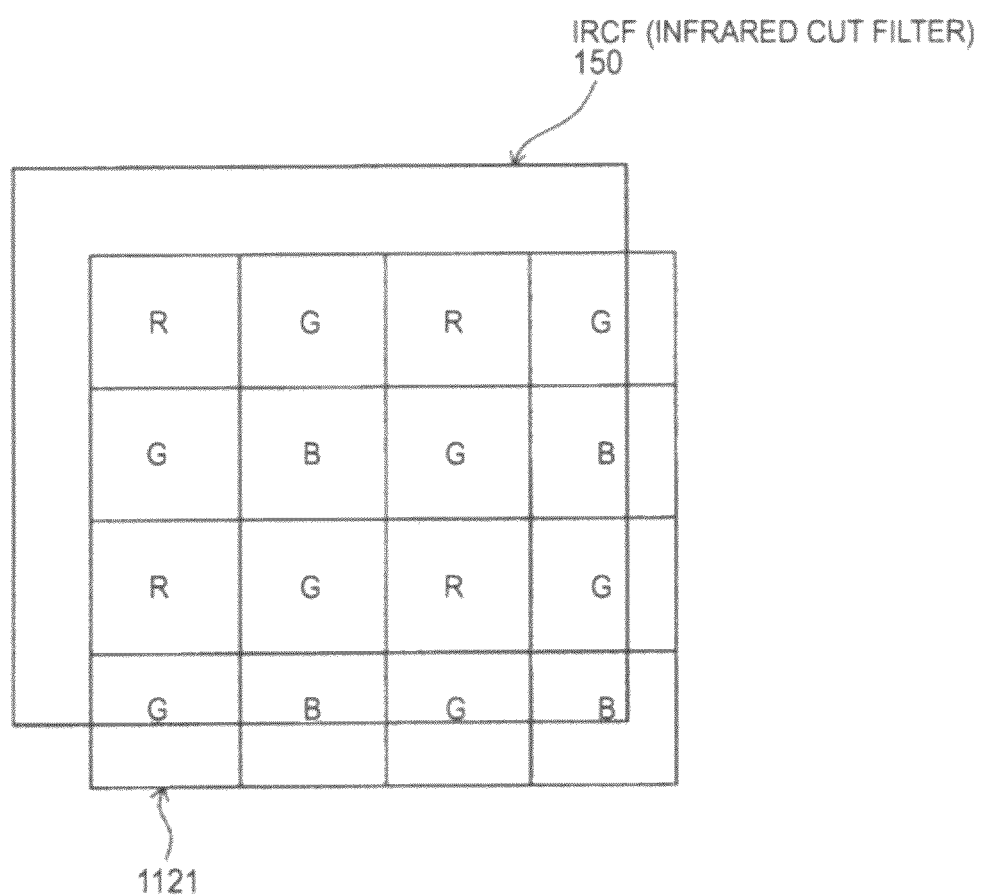
FIG. 6 is a view showing a structure example of color filters according to the embodiment.

In the color filters 1121, color filters of R (red), G (green) and B (blue) which are primary colors are formed in an array state of Bayer arrangement as on-chip color filters (OCCF), as shown, for example, FIG. 6. It is not necessary that an arrangement pattern of the color filters is limited to the Bayer pattern.

In the example of FIG. 6, an infrared cut filter (IRCF) 150 is formed so as to overlap the color filters 1121.

In the present embodiment, the IRCF 150 can be provided in addition to the control film as described later as well as it is also preferable that the IRCF 150 is not arranged as a film different from the control film 140 because the control film 140 has also functions of the IRCF.

In the light receiving unit 112, a microlens array 1123 for collecting incident light to respective pixels is arranged further on the front surface side of the color filters 1122.

Also in the light receiving unit 112, for example, a reflection prevention film and so on are formed on the further front surface side of the microlens array 1123.

The resin layer 130 as the intermediate layer is formed between the light receiving unit 112 having the above structure and an opposite surface 121 of the seal material (seal glass) 120 facing the light receiving unit 112. The thickness of the resin layer 130 is set to approximately 50 μm. The thickness of the seal glass 120 is set to approximately 450 to 500 μm.

The control film 140 is arranged between the resin layer 130 as the intermediate layer and the opposite surface 121 of the seal material 120.

The basic structure of the imaging device 100 according to the embodiment has been explained as the above.

Hereinafter, a further specific structure and functions of the imaging device 100 will be explained with a focus on a structure and functions of the control film 140 which is a characteristic component of the embodiment.

<2. Basic Structure and Functions of a Control Film (Multilayer Film)>

The control film 140 has a function in which a cutoff wavelength is shifted to the shortwave side in accordance with an incident angle of light which is obliquely incident on the film. The control film 140 is made of a multilayer film 140A (for example, refer to FIG. 7A) including plural films with different refractive indexes.

In the multilayer film 140A, two or more kinds of film materials are arranged alternately in the order of a high refractive index and a low refractive index. The multilayer film 140A is formed so that difference in refractive indexes between a material having the maximum refractive index and a material having the minimum refractive index in two kinds of film materials is higher than 0.5.

The multilayer film 140A is formed by disposing films of six layers or more each having 50 nm to 150 nm in film thickness.

The multilayer film 140A as the control film 140 has functions as the infrared cut filter IRCF shielding light in an infrared range.

As described above, it is also possible to apply a structure in which the IRCF 150 shielding light in the infrared range is arranged in an optical path to the light receiving unit 112 of the optical sensor in addition to the multilayer film 140A.

In this case, cutoff wavelengths and cutoff line widths of the multilayer film 140A and the IRCF 150 satisfy the following condition.

$$\lambda cf\_IRCF + \Delta\lambda cf\_IRCF/2 < \lambda cf\_ML - \Delta\lambda cf\_ML/2 \quad (1)$$

Here, $\lambda cf\_IRCF$ represents the cutoff wavelength of the infrared cut filter, $\Delta\lambda cf\_IRCF$ represents the cutoff line width of the infrared cut filter, $\lambda cf\_ML$ represents the cutoff wavelength of the control film and $\Delta\lambda cf\_ML$ represents the cutoff line width of the control film, respectively.

Additionally, the multilayer film 140A is arranged at an intermediate height between the light receiving unit 112 of the optical sensor 110 and the light incident surface (upper surface) 122 of the seal glass 120, for example, in a height of 200 μm.

<3. Specific Structure and Functions of the Control Film (Multilayer Film)>

As described above, the imaging device 100 is provided with the multilayer film 140A at a portion corresponding to an boundary between the resin layer 130 and the opposite surface (lower surface) 121 of the cover glass 120 facing the light receiving unit 112 for suppressing occurrence of flare light.

The multilayer film 140A has functions of transmitting almost all of light vertically incident on light incident/emitting surfaces 140a and 140b in a visible region as well as reflecting almost all of the incident light in a near-infrared region.

The multilayer film 140A has a property in which the cutoff wavelength is shifted to the shortwave side in accordance with the angle of light obliquely incident on the light incident/emitting surfaces 140a and 140b.

The imaging device 100 according to the embodiment utilizes the above property to thereby selectively reflecting high-order diffraction components contributed to total reflection in reflection diffraction light from the receiving portion 112 of the optical sensor 110 in a multilayer film portion to prevent diffusion of flare light.

The shift of a cutoff frequency is generally represented by the following expression when the incident angle is θ.

$$\lambda CF(\theta) = \lambda CF(0) * \cos(\theta) \quad (2)$$

Here, $\lambda CF(\theta)$ represents the cutoff frequency of the incident angle θ and $\lambda CF(0)$ represents the cutoff frequency of an incident angle 0 degree, respectively.

Figure 7A:
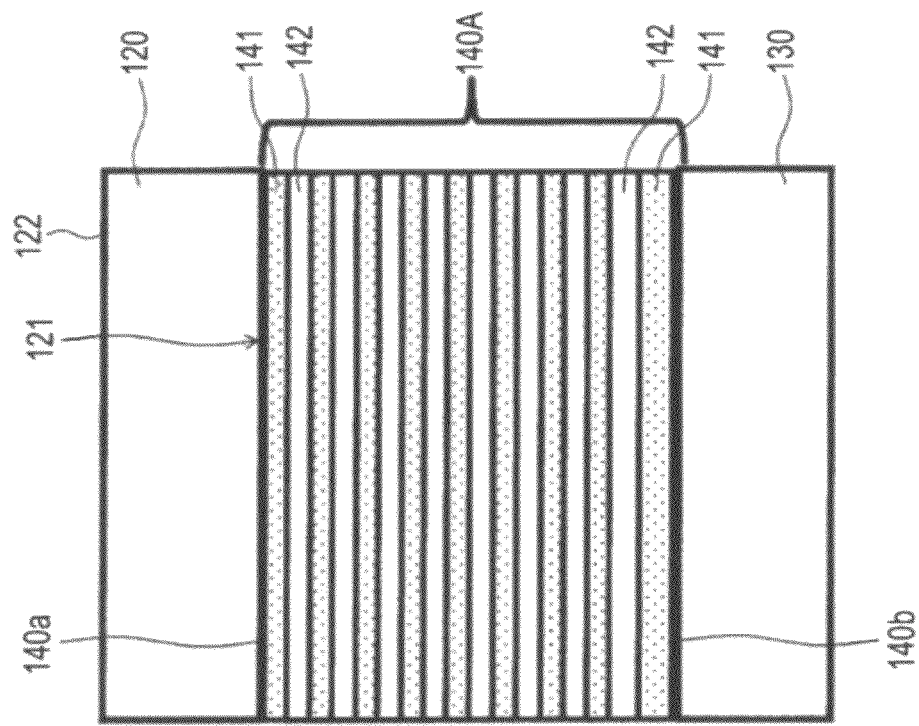
FIGS. 7A and 7B are views showing a characteristic example of the multilayer film and an example of the film structure according to the embodiment.
Figure 7B:
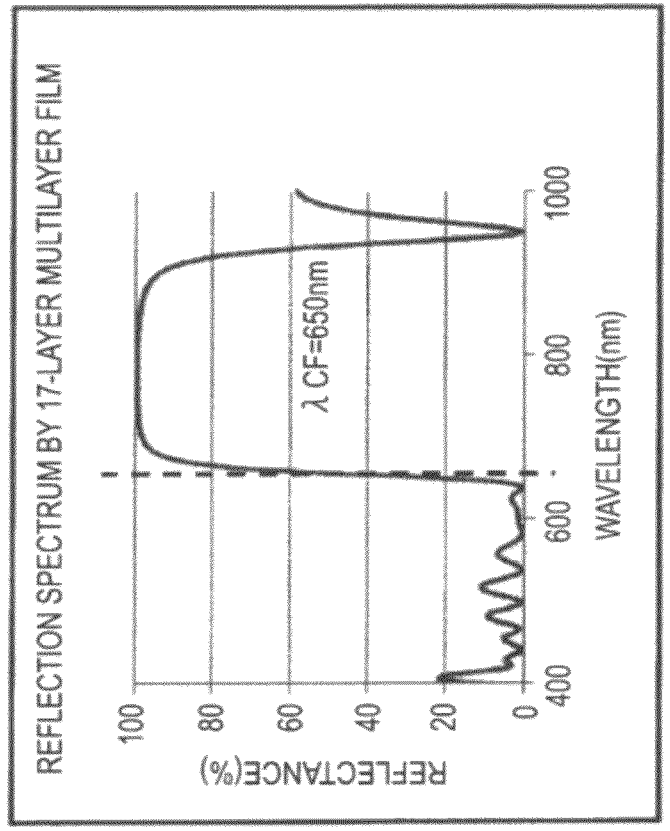

FIGS. 7A and 7B are views showing a characteristic example of the multilayer film and an example of the film structure according to the embodiment. FIG. 7A shows the characteristic example of the multilayer example and FIG. 7B shows the example of the film structure.

In the example, the multilayer film 140A is formed as a multilayer film having 17 layers in which TiO2 is used as a first film 141 having a high refractive index, SiO2 is used as a second film 142 having a low refractive index as multilayer film materials and the first film 141 and the second film 142 are alternately arranged.

FIG. 7B shows optical characteristics which can be realized when forming the 17-layer multilayer film 140A, in which the cutoff wavelength is set to 650 nm.

The cutoff wavelength with respect to flare due to the total reflection of the multilayer film 140A can be represented by the following expression from the total reflection conditions.

$$\sin \theta tir = 1/ng \quad (3)$$

Here, θtir represents a critical angle and "ng" represents a refractive index of the cover glass 120, respectively.

For example, assume that the refractive index "ng" of the cover glass 120 is 1.51, the critical angle θtir=41deg is derived.

When the above is substituted into θ in the expression (2), the cutoff wavelength of flare due to the total reflection will be $\lambda CF(\theta tir) \cong 490$ nm, and it is possible to estimate that the multilayer film is effective for a visible range of at least 490 nm or more.

FIGS. 8A to 8C are views showing results obtained by simulating reflectance on the upper surface of the cover glass in the case where the multilayer film is inserted between the resin and the lower surface of the cover glass and the case where the film is not inserted.

FIG. 8A shows the simulation results, FIG. 8B schematically shows a state where the multilayer film is not inserted between the resin and the lower surface of the cover glass and FIG. 8C schematically shows a state where the multilayer film is inserted between the resin and the lower surface of the cover glass.

In the simulation, the pixel size of the optical sensor 110 is assumed to be 1.4 μm, a reflection electric field of which is derived from strict electromagnetic field analysis.

The result is based on calculation supporting the effect of the shift of the cutoff wavelength by the multilayer film 140A quantitatively, and the effect of measures can be theoretically explained.

Figure 9:
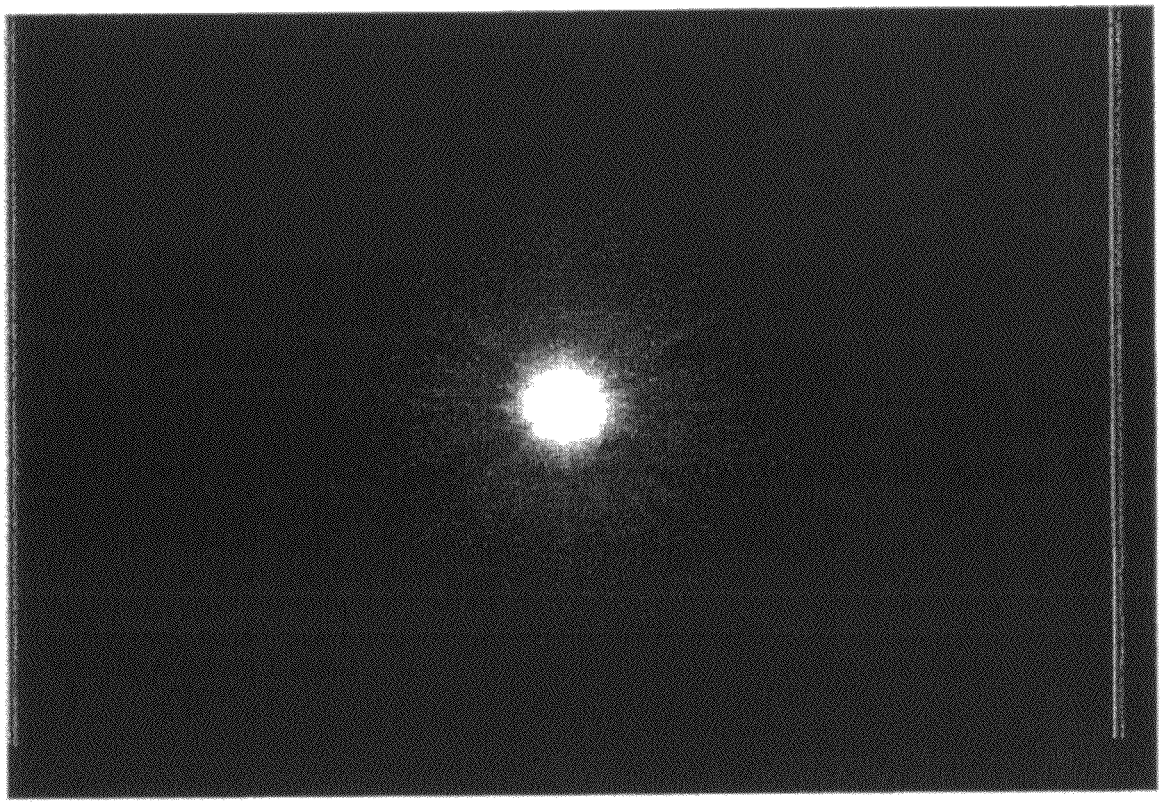
FIG. 9 is a view showing flare light occurring in the cavity-less CSP structure in which the gap does not exist as well as the multilayer film is arranged according to the embodiment.

FIG. 9 is a view showing flare light occurring in the cavity-less CSP structure in which the gap does not exist as well as the multilayer film is arranged according to the embodiment.

As seen from FIG. 9, it has been confirmed that the multilayer film 140A has the effect of suppressing flare light in actual devices, and the effect of suppressing flare by the multilayer film as the control film is obvious.

<4. Typical Structure and Functions of the Control Film (Multilayer Film)>

A typical structure of the imaging device 100 is basically the structure including the multilayer film 140A as the control film 140 as described above. Conditions of the film structure of the multilayer film and a place of arranging the film will be important here.

It is necessary that the multilayer structure has the following optical characteristics for functioning as measures for flare.

The cutoff wavelength is in the infrared range with respect to vertical incident on the light incident/emitting surfaces 140*a* and 140*b* of the multilayer film 140A, and the cutoff wavelength is in the visible range in a diffraction angle of the total reflection flare.

Transmittance is sufficiently higher than the cutoff wavelength in the shortwave side (80% or more) and transmittance is sufficiently lower than the cutoff wavelength in the longwave side (20% or less).

Figure 10A:
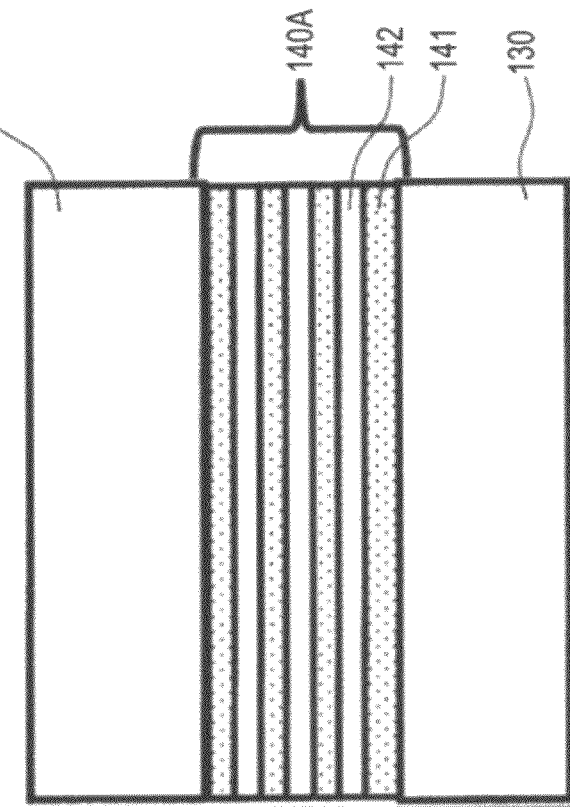
FIGS. 10A and 10B show views showing results obtained by estimating a condition of the minimum number of films satisfying optical characteristics for allowing the multilayer film to function as flare measures.
Figure 10B:
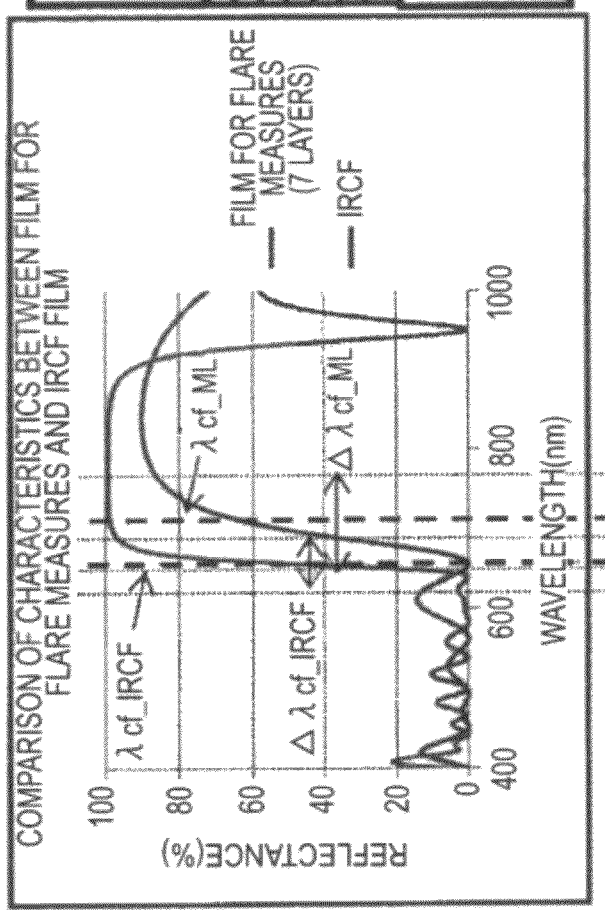

FIGS. 10A and 10B show views showing results obtained by estimating a condition of the minimum number of films satisfying optical characteristics for allowing the multilayer film to function as flare measures. FIG. 10A shows a characteristic example of the multilayer film and FIG. 10B shows an example of the film structure.

When the following conditions can be satisfied as the structure of the multilayer film by the calculation, the multilayer film can function as flare measures.

The total number of films is six layers or more (seven layers in design) with the first film 141 and the second film 142.

The thickness of each film is approximately $\lambda CF/4/n$.

Here, $\lambda CF$ represents the design cutoff wavelength and "n" represents the refractive index.

For example, the value corresponds to approximately 50 to 150 nm as $\lambda CF$ is 650 nm and "n" (the high-refractive index n_high is 2.2 to 2.5 and the low-refractive index n_low is 1.4 to 1.6).

The difference $\Delta$ in refractive indexes between a material having the maximum refractive index and a material having the minimum refractive index is 0.5 or more (the value used in FIG. 10A is $\Delta n$=approximately 1).

The above conditions of the multilayer film can be also used in the IRCF (infrared cutoff filter) which is usually used in the camera module.

That is, when the IRCF which has been generally disposed as a separate component is removed and a desired IRCF characteristic is given to the multilayer film 140A, the reduction in the number of components of the camera module can be expected.

On the other hand, the method of disposing the IRCF and the multilayer film 140A separately can be also applied.

In this case, it is necessary to set the cutoff wavelength and the cutoff line width of the multilayer film for not affecting characteristics of the IRCF.

Accordingly, it is necessary to satisfy the conditions of the above expression (1) by setting the cutoff wavelength of the IRCF to $\lambda cf\_IRCF$, the cutoff line width thereof to $\Delta\lambda cf\_IRCF$, the cutoff wavelength of the multilayer film (ML) to $\lambda cf\_ML$ and the cutoff line width thereof to $\Delta\lambda cf\_ML$.

$$\lambda cf\_IRCF+\Delta\lambda cf\_IRCF/2 < \lambda cf\_ML-\Delta\lambda cf\_ML/2 \quad (1)$$

The height of arranging the multilayer film 140A is important for the film functioning as flare measures. Here, the height of arranging the multilayer film 140A indicates an arrangement position (height) from a given surface of the light receiving unit 112 of the optical sensor 110, for example, the arrangement position (height) from the light receiving surface 1121.

Figure 11A:
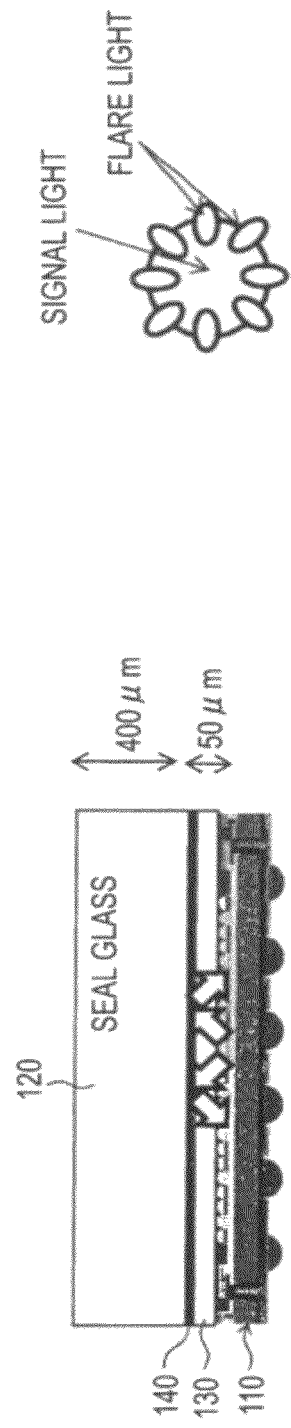
FIGS. 11A and 11B show the relation between the arrangement position (height) of the multilayer film and diffusion of flare.
Figure 11B:
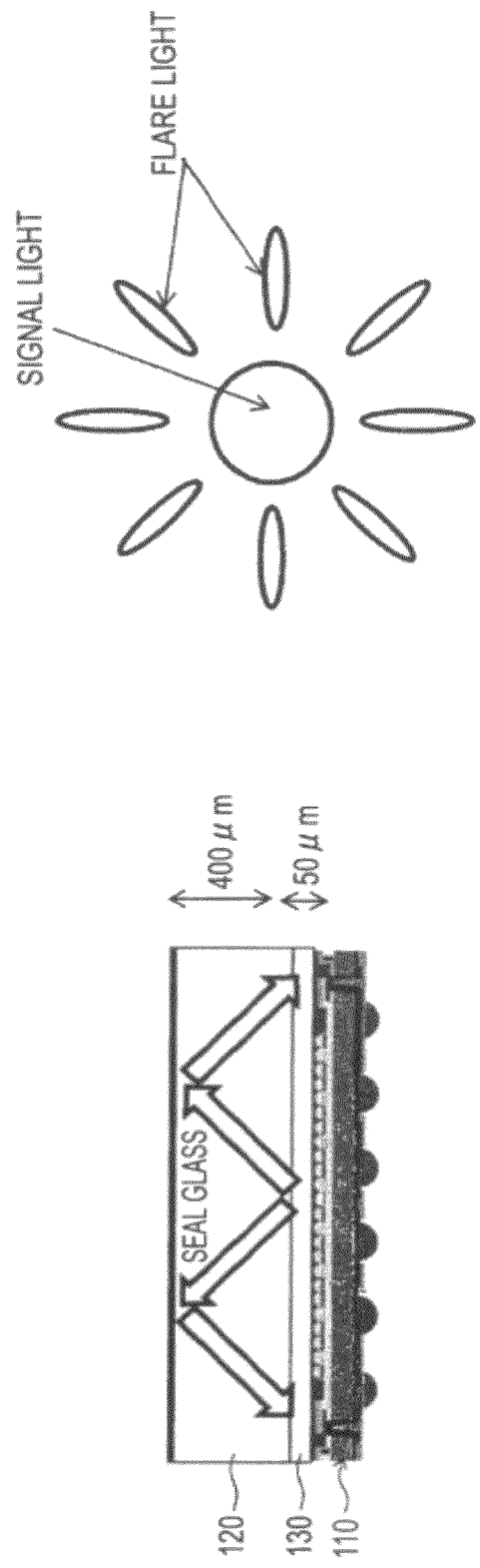

FIGS. 11A and 11B show the relation between the arrangement position (height) of the multilayer film and diffusion of flare. FIG. 11A shows a case where the multilayer film does not exist and FIG. 11B shows a case where the multilayer film exists.

As can be seen from the drawings, as higher the position of the multilayer film 140A is, the larger the diffusion of flare light becomes.

The height=(thickness of resin) of the multilayer film 140A effective in the above experiment result was 50 μm.

On the other hand, the position of the upper surface 121 of the seal glass (cover glass) 120 having a problem in the total reflection is 450 μm, and it is obvious that the multilayer film does not function as flare measures when the multilayer film is arranged in the height.

Considering the above, it is desirable that the arrangement height of the multilayer film is lower than 200 μm which is intermediate in the value (approximately 400 μm).

As a method of manufacturing the multilayer film, it is possible to apply a method of depositing the film on the resin over the sensor and a method of depositing the film on the glass and bonding the film to the resin.

However, it is extremely difficult to form an inorganic film having a high refractive index on the resin with high accuracy, and the latter method is desirable as the manufacturing method. Accordingly, it is desirable that an adhesive layer is arranged between the resin and the multilayer film.

Additionally, the structure has optically the same functions as a seal glass-less structure as disclosed in, for example, JP-A-2003-31782, because glass and resin have approximately the same refractive index.

Therefore, when the above respective conditions are satisfied, it is obvious that the present disclosure can be applied also to the above structure.

<5. Second Structure Example of the Imaging Device>

FIG. 12 is a view showing a second structure example of an imaging device according to the embodiment.

An imaging device 100A of FIG. 12 differs from the imaging device 100 of FIG. 5 in the following points.

In the imaging device 100 of FIG. 5, the optical sensor 110 has the light receiving unit 112 formed on the front surface 111*a* of the sensor substrate 111 and the connection electrodes 113 such as bumps formed on the rear surface 111*b*.

On the other hand, in the imaging device 100A of FIG. 12, an optical sensor 110A is attached on one surface 160*a* of an interposer 160 at the rear surface 111*b* of the sensor substrate 111 through a die-bonding material 170.

Wire-bonding pads PD111 and PD112 formed on a peripheral portion of the front surface 111*a* of the sensor substrate 111 and wire-bonding pads PD161 and PD162 formed on a peripheral portion of one surface 160*a* of the interposer 160 are connected by wire-bonding wiring WBL.

Other components of the imaging device 100A are the same as the imaging device 100, and functions as the control film 140 made of the multilayer film are as described above.

As explained above, it is possible to suppress occurrence of flare light and obtain good quality images in which flare light is inconspicuous even when a bright light source enters the visual field.

The imaging devices 100 and 100A can be applied to a camera module having an imaging lens.

<6. Structure Example of a Camera Module>

FIG. 13 is a view showing a structure example of a camera module according to the embodiment.

In a camera module 200, an imaging lens 210 which focuses an object image on the light receiving unit 112 of the optical sensor 110 is arranged in a front surface side (object's side) of the imaging device 100. The imaging device 100 of FIG. 5 is shown as an example in FIG. 13, however, the imaging device 100A of FIG. 12 can be also applied.

The camera module 200 includes a not-shown signal processing unit and so on in addition to the imaging lens 210.

In the camera module 200 having the above structure, light from the object taken by the imaging lens 210 is optically processed in the light receiving unit so as to be smoothly converted into an electric signal in the imaging device. After that, the light is led to a photoelectric converting unit in the optical sensor 110, where given signal processing is performed to the electric signal obtained by photoelectric conversion in a subsequent signal processing unit.

Also in the camera module according to the embodiment, it is possible to suppress occurrence of flare light and obtain good quality images in which flare light is inconspicuous even when a bright light source enters the visual field.

The present disclosure can apply the following configurations.

(1) An imaging device including:
an optical sensor including a light receiving unit capable of forming an object image,
a seal material for protecting the light receiving unit of the optical sensor,
an intermediate layer formed at least between the light receiving unit and an opposite surface of the seal material facing the light receiving unit, and
a control film arranged between the intermediate layer and the opposite surface of the seal material,
in which, in the control film, a cutoff wavelength is shifted to a shortwave side in accordance with an incident angle of light which is obliquely incident on the film.

(2) The imaging device described in the above (1),
in which the control film is made of a multilayer film including plural films with different refractive indexes.

(3) The imaging device described in the above (2),
in which the multilayer film includes two or more kinds of film materials arranged alternately in the order of a high refractive index and a low refractive index.

(4) The imaging device described in the above (3),
in which the multilayer film is formed so that difference in refractive indexes between a material having the maximum refractive index and a material having the minimum refractive index in two or more kinds of film materials is higher than 0.5.

(5) The imaging device described in the above (3) or (4),
in which the multilayer film is formed by disposing films of six layers or more each having 50 nm to 150 nm in film thickness.

(6) The imaging device described in any one of the above (1) to (5),
in which the control film has functions as an infrared cut filter shielding light in an infrared range.

(7) The imaging device described in any one of the above (1) to (6),
in which an infrared cut filter shielding light in an infrared range is arranged in an optical path to the light receiving unit of the optical sensor in addition to the control film.

(8) The imaging device described in the above (7),
in which cutoff wavelengths and cutoff line widths of the multilayer film and the infrared cut filter satisfy the following condition:

$$\lambda cf\_IRCF + \Delta\lambda cf\_IRCF/2 < \lambda cf\_ML - \Delta\lambda cf\_ML/2.$$

Here, $\lambda cf\_IRCF$ represents the cutoff wavelength of the infrared cut filter, $\Delta\lambda cf\_IRCF$ represents the cutoff line width of the infrared cut filter, $\lambda cf\_ML$ represents the cutoff wavelength of the control film and $\Delta\lambda cf\_ML$ represents the cutoff line width of the control film, respectively.

(9) The imaging device described in any one of the above (1) to (8),
in which the control film is arranged at an intermediate height between the light receiving unit of the optical sensor and a light incident surface of the seal material.

(10) The imaging device described in any one of the above (1) to (9),
in which the seal material on an upper layer of the control film is made of glass.

(11) The imaging device described in any one of the above (1) to (10),
in which the control film is directly deposited on the opposite surface of the seal material.

(12) A camera module including:
an optical sensor including a light receiving unit capable of forming an object image,
a seal material for protecting the light receiving unit of the optical sensor,
an intermediate layer formed at least between the light receiving unit and an opposite surface of the seal material facing the light receiving unit,
a control film arranged between the intermediate layer and the opposite surface of the seal material, and
a lens forming an object image on the light receiving unit of the optical sensor,
in which, in the control film, a cutoff wavelength is shifted to a shortwave side in accordance with an incident angle of light which is obliquely incident on the film.

(13) The camera module described in the above (12),
in which the control film is made of a multilayer film including plural films with different refractive indexes.

(14) The camera module described in the above (13),
in which the multilayer film includes two or more kinds of film materials arranged alternately in the order of a high refractive index and a low refractive index.

(15) The camera module described in the above (14),
in which the multilayer film is formed so that difference in refractive indexes between a material having the maximum refractive index and a material having the minimum refractive index in two or more kinds of film materials is higher than 0.5.

(16) The camera module described in the above (14) or (15),
in which the multilayer film is formed by disposing films of six layers or more each having 50 nm to 150 nm in film thickness.

(17) The camera module described in any one of the above (12) to (16),
in which the control film has functions as an infrared cut filter shielding light in a infrared range.

(18) The camera module described in any one of the above (12) to (17),
in which an infrared cut filter shielding light in an infrared range is arranged in an optical path to the light receiving unit of the optical sensor in addition to the control film.

(19) The camera module described in the above (18),
in which cutoff wavelengths and cutoff line widths of the multilayer film and the infrared cut filter satisfy the following condition:

$$\lambda cf\_IRCF + \Delta\lambda cf\_IRCF/2 < \lambda cf\_ML - \Delta\lambda cf\_ML/2.$$

Here, $\lambda cf\_IRCF$ represents the cutoff wavelength of the infrared cut filter, $\Delta\lambda cf\_IRCF$ represents the cutoff line width of the infrared cut filter, $\lambda cf\_ML$ represents the cutoff wavelength of the control film and $\Delta\lambda cf\_ML$ represents the cutoff line width of the control film, respectively.

(20) The camera module described in any one of the above (12) to (19),
in which the control film is arranged at an intermediate height between the light receiving unit of the optical sensor and a light incident surface of the seal material.

The present disclosure contains subject matter related to that disclosed in Japanese Priority Patent Application JP 2011-036337 filed in the Japan Patent Office on Feb. 22, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device comprising:
an optical sensor including a light receiving unit capable of forming an object image;
a seal material for protecting the light receiving unit of the optical sensor;
an intermediate layer formed at least between the light receiving unit and an opposite surface of the seal material facing the light receiving unit;
a control film arranged between the intermediate layer and the opposite surface of the seal material; and
an infrared cut filter shielding light in an infrared range arranged in an optical path to the light receiving unit of the optical sensor, wherein
in the control film, a cutoff wavelength is shifted to a shortwave side in accordance with an incident angle of light which is obliquely incident on the film, and
cutoff wavelengths and cutoff line widths of the multilayer film and the infrared cut filter satisfy the following condition:

$$\lambda cf\_IRCF + \Delta\lambda cf\_IRCF/2 < \lambda cf\_ML - \Delta\lambda cf\_ML/2$$

where, $\lambda cf\_IRCF$ represents a cutoff wavelength of the infrared cut filter, $\Delta\lambda cf\_IRCF$ represents a cutoff line width of the infrared cut filter, $\lambda cf\_ML$ represents a cutoff wavelength of the control film and $\Delta\lambda cf\_ML$ represents a cutoff line width of the control film.

2. The imaging device according to claim 1, wherein the control film is made of a multilayer film including plural films with different refractive indexes.

3. The imaging device according to claim 2, wherein the multilayer film includes two or more kinds of film materials arranged alternately in the order of a high refractive index and a low refractive index.

4. The imaging device according to claim 3, wherein the multilayer film is formed so that difference in refractive indexes between a material having the maximum refractive index and a material having the minimum refractive index in two or more kinds of film materials is higher than 0.5.

5. The imaging device according to claim 4, wherein the multilayer film is formed by disposing films of six layers or more each having 50 nm to 150 nm in film thickness.

6. The imaging device according to claim 1, wherein the control film has functions as an infrared cut filter shielding light in an infrared range.

7. The imaging device according to claim 1, wherein the control film is arranged at an intermediate height between the light receiving unit of the optical sensor and a light incident surface of the seal material.

8. The imaging device according to claim 1, wherein the seal material on an upper layer of the control film is made of glass.

9. The imaging device according to claim 1, wherein the control film is directly deposited on the opposite surface of the seal material.

10. A camera module comprising:
an optical sensor including a light receiving unit capable of forming an object image;
a seal material for protecting the light receiving unit of the optical sensor;
an intermediate layer formed at least between the light receiving unit and an opposite surface of the seal material facing the light receiving unit;
a control film arranged between the intermediate layer and the opposite surface of the seal material; and
a lens forming an object image on the light receiving unit of the optical sensor; and
an infrared cut filter shielding light in an infrared range arranged in an optical path to the light receiving unit of the optical sensor, wherein
in the control film, a cutoff wavelength is shifted to a shortwave side in accordance with an incident angle of light which is obliquely incident on the film, and
cutoff wavelengths and cutoff line widths of the multilayer film and the infrared cut filter satisfy the following condition:

$$\lambda cf\_IRCF + \Delta\lambda cf\_IRCF/2 < \lambda cf\_ML - \Delta\lambda cf\_ML/2$$

where, $\lambda cf\_IRCF$ represents a cutoff wavelength of the infrared cut filter, $\Delta\lambda cf\_IRCF$ represents a cutoff line width of the infrared cut filter, $\lambda cf\_ML$ represents a cutoff wavelength of the control film and $\Delta\lambda cf\_ML$ represents a cutoff line width of the control film.

11. The camera module according to claim 10, wherein the control film is made of a multilayer film including plural films with different refractive indexes.

12. The camera module according to claim 11, wherein the multilayer film includes two or more kinds of film materials arranged alternately in the order of a high refractive index and a low refractive index.

13. The camera module according to claim 12, wherein the multilayer film is formed so that difference in refractive indexes between a material having the maximum refractive index and a material having the minimum refractive index in two or more kinds of film materials is higher than 0.5.

14. The camera module according to claim 13, wherein the multilayer film is formed by disposing films of six layers or more each having 50 nm to 150 nm in film thickness.

15. The camera module according to claim 10, wherein the control film has functions as an infrared cut filter shielding light in a infrared range.

16. The camera module according to claim 10, wherein the control film is arranged at an intermediate height between the light receiving unit of the optical sensor and a light incident surface of the seal material.

* * * * *